United States Patent
Kurusu et al.

(10) Patent No.: US 9,553,568 B2
(45) Date of Patent: Jan. 24, 2017

(54) FREQUENCY MULTIPLIER

(71) Applicant: Mitsubishi Electric Corporation, Tokyo (JP)

(72) Inventors: Hitoshi Kurusu, Tokyo (JP); Yoshihiro Tsukahara, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 14/925,344

(22) Filed: Oct. 28, 2015

(65) Prior Publication Data
US 2016/0241221 A1 Aug. 18, 2016

(30) Foreign Application Priority Data

Feb. 13, 2015 (JP) ................. 2015-026705

(51) Int. Cl.
G06G 7/16 (2006.01)
H03B 19/10 (2006.01)
H03B 19/14 (2006.01)
H03K 5/00 (2006.01)

(52) U.S. Cl.
CPC ............ H03K 5/00006 (2013.01); G06G 7/16 (2013.01); H03B 19/10 (2013.01); H03B 19/14 (2013.01)

(58) Field of Classification Search
CPC ........... G06G 7/16; H03B 19/10; H03B 19/14; H03K 5/00006
USPC ......................................... 327/119, 122, 356
See application file for complete search history.

(56) References Cited

U.S. PATENT DOCUMENTS

| 4,327,343 | A | * | 4/1982 | Cornish | ................. | H03B 19/14 327/118 |
| 5,072,142 | A | | 12/1991 | Tanino | | |
| 5,661,437 | A | * | 8/1997 | Nishikawa | ................ | H03F 1/34 330/282 |
| 2001/0017556 | A1 | | 8/2001 | Tokumitsu et al. | | |
| 2002/0024411 | A1 | * | 2/2002 | Uchino | ................. | H03B 19/14 333/218 |

FOREIGN PATENT DOCUMENTS

| JP | H01-213007 A | 8/1989 |
| JP | H03-158008 A | 7/1991 |
| JP | H03-201801 A | 9/1991 |
| JP | 2001-244746 A | 9/2001 |
| JP | 2010-016532 A | 1/2010 |

* cited by examiner

Primary Examiner — William Hernandez
(74) Attorney, Agent, or Firm — Studebaker & Brackett PC

(57) ABSTRACT

A frequency multiplier includes an input terminal, an output terminal, a first transistor having a first gate to which a radiofrequency signal is input from the input terminal, a first drain from which an output signal is issued to the output terminal, and a first source, a second transistor having a second gate, a second source to which the radiofrequency signal is input from the input terminal, and a second drain from which an output signal is issued to the output terminal, and a stabilizing resistor which is a resistor connected to the second gate, wherein no resistor exists on the path for the radiofrequency signal, and wherein the stabilizing resistor suppresses a reflex gain produced by the second transistor.

7 Claims, 2 Drawing Sheets

FREQUENCY MULTIPLIER

BACKGROUND OF THE INVENTION

Field of the Invention

The present invention relates to a frequency multiplier which multiplies electric power, for example, in a microwave or milliwave radiofrequency band.

Background Art

Japanese Patent Laid-Open No. 3-158008 discloses a frequency multiplier in which a source-grounded transistor and a gate-grounded transistor are connected in parallel with each other. From electric power of a fundamental frequency input to this frequency multiplier, the source-grounded transistor outputs electric power in the opposite phase and the gate-grounded transistor outputs electric power in phase with the input. Therefore these electric powers cancel out when combined at the output side. Electric powers of the second-order harmonic frequency which are output in phase with each other from the two transistors are taken out from an output terminal.

Japanese Patent Laid-Open No. 2001-244746 discloses the provision of damping resistors on the output sides of the two transistors for stabilization.

The frequency multiplier disclosed in Japanese Patent Laid-Open No. 3-158008 has a problem that oscillation occurs due to a negative resistance characteristic of the gate-grounded transistor exhibited in a high-frequency band such as a microwave or milliwave band.

The frequency multiplier disclosed in Japanese Patent Laid-Open No. 2001-244746 has a problem that electric power of the second-order harmonic frequency generated by the transistors is consumed by the damping resistors and a conversion gain which is a characteristic of the frequency multiplier is reduced.

SUMMARY OF THE INVENTION

The present invention has been achieved to solve the above-described problems, and an object of the present invention is to provide a frequency multiplier capable of reducing instabilities such as a negative resistance characteristic exhibited by a gate-grounded transistor without providing any resistor on a path through which a radiofrequency passes.

The features and advantages of the present invention may be summarized as follows.

According to one aspect of the present invention, a frequency multiplier includes an input terminal, an output terminal, a first transistor having a first gate to which a radiofrequency signal is input from the input terminal, a first drain from which an output signal is issued to the output terminal, and a first source, a second transistor having a second gate, a second source to which the radiofrequency signal is input from the input terminal, and a second drain from which an output signal is issued to the output terminal, and a stabilizing resistor which is a resistor connected to the second gate, wherein no resistor exists on the path for the radiofrequency signal, and wherein the stabilizing resistor suppresses a reflex gain produced by the second transistor.

Other and further objects, features and advantages of the invention will appear more fully from the following description.

DETAILED DESCRIPTION OF THE PREFERRED EMBODIMENTS

Figure 1:
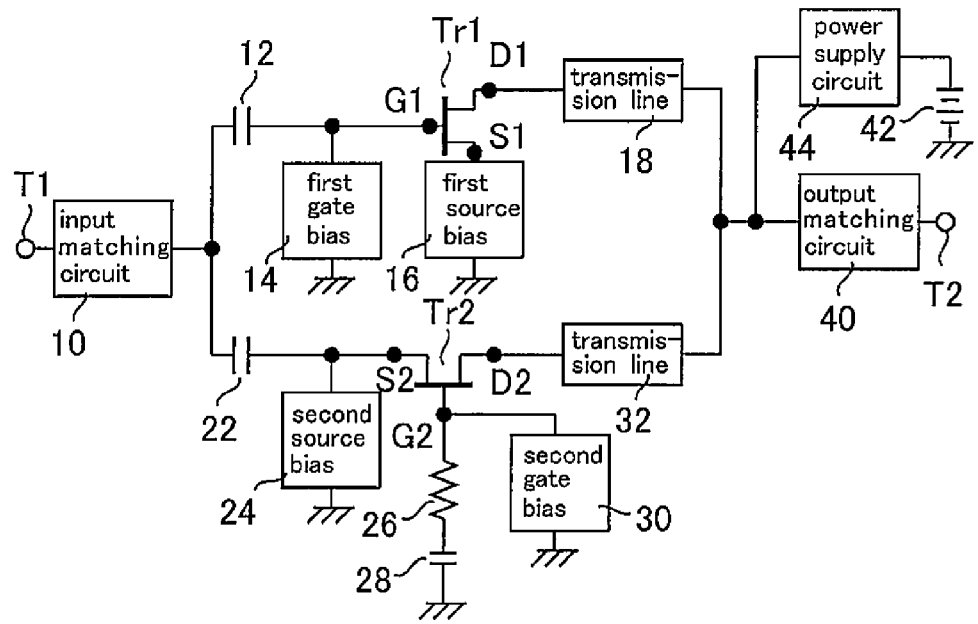
FIG. 1 is a circuit diagram of a frequency multiplier according to a first embodiment.

A frequency multiplier according to an embodiment of the present invention will be described with reference to the drawings. Components identical or corresponding to each other are indicated by the same reference characters and repeated description for them is omitted in some cases.

First Embodiment

FIG. 1 is a circuit diagram of a frequency multiplier according to a first embodiment of the present invention. This frequency multiplier multiplies the frequency of a radiofrequency signal input to an input terminal T1 by an integer multiple and outputs the resulting signal through an output terminal T2. An input matching circuit 10 is connected to the input terminal T1. An output matching circuit 40 is connected to the output terminal T2.

The frequency multiplier according to the first embodiment includes a first transistor Tr1, which is a source-grounded transistor, and a second transistor Tr2, which is a gate-grounded transistor. The first transistor Tr1 has a first gate G1 to which a radiofrequency signal is supplied from the input terminal T1, a first drain D1 from which an output signal is issued to the output terminal T2, and a first source S1 grounded.

The first gate G1 is connected to the input matching circuit 10 through a direct current blocking capacitor 12. A first gate bias circuit 14 is connected between the first gate G1 and a grounding conductor. A first source bias circuit 16 is connected between the first source S1 and a grounding conductor. The first drain D1 is connected to the output matching circuit 40 through a transmission line 18.

The second transistor Tr2 has a second gate G2, a second source S2 to which a radiofrequency signal is supplied from the input terminal T1, and a second drain D2 from which an output signal is issued to the output terminal T2.

The second source S2 is connected to the input matching circuit 10 through a direct current blocking capacitor 22. A second source bias circuit 24 is connected between the second source S2 and a grounding conductor. A stabilizing resistor 26, i.e., a resistor, and a capacitor 28 are connected between the second gate G2 and the ground. Further, a second gate bias circuit 30 is connected between the second gate G2 and a grounding conductor. The second drain D2 is connected to the output matching circuit 40 through a transmission line 32.

A power supply circuit 44 connected to a power supply 42 is connected to output sides of the transmission lines 18 and 32. As is apparent from FIG. 1, no resistor exists on the radiofrequency signal paths from the input terminal T1 to the output terminal T2.

The operation of the frequency multiplier according to the first embodiment of the present invention will be described. The bias voltage between the gate and source of the first transistor Tr1 is set in the vicinity of the pinch-off voltage of the first transistor Tr1. The bias voltage between the gate and source of the second transistor Tr2 is set in the vicinity of the pinch-off voltage of the second transistor Tr2.

When a radiofrequency signal (sinusoidal wave) is supplied to the input terminal T1, the first transistor Tr1 outputs a rectified positive half wave and the second transistor Tr2 outputs a rectified negative half wave with the inverted polarity. The fundamental wave and odd harmonics contained in the signal output from the drain of the first transistor Tr1 and those contained in the signal output from the drain of the second transistor Tr2 are in phase opposition to each other and therefore cancel out. Even harmonics output from the drains of the first and second transistors Tr1 and Tr2 are in phase with each other and therefore intensify each other. Electric power of the second-order harmonic frequency can therefore be taken out from the output terminal T2.

A Y-parameter ($Y_{source}$) of the first transistor Tr1 simplified and not having its parasitic components described is expressed as follows.

$$Y_{Source} = \begin{pmatrix} j\omega(C_{gs}+C_{dg}) & -j\omega C_{dg} \\ g_m - j\omega C_{dg} & j\omega(C_{ds}+C_{dg}) \end{pmatrix} \quad \text{[Expression 1]}$$

A Y-parameter ($Y_{Gate}$) of the second transistor Tr2 is expressed as follows.

$$Y_{Gate} = \begin{pmatrix} g_m + j\omega(C_{gs}+C_{ds}) & -j\omega C_{ds} \\ -(g_m + j\omega C_{ds}) & j\omega(C_{ds}+C_{dg}) \end{pmatrix} \quad \text{[Expression 2]}$$

An S-parameter $S_{22}$ which represents a reflection coefficient at the output side is expressed therefrom as follows. The following expression is formed without considering the stabilizing resistor 26.

$$S_{22} = \frac{1 + g_m + \omega^2(C_{gs}C_{ds}+C_{gs}C_{dg}+C_{ds}C_{dg}) + j\omega(C_{gs}-C_{dg}-g_mC_{dg})}{1 + g_m - \omega^2(C_{gs}C_{ds}+C_{gs}C_{dg}+C_{ds}C_{dg}) + j\omega(C_{gs}+C_{dg}+2C_{ds}+g_mC_{dg})} \quad \text{[Expression 3]}$$

This expression shows that $|S_{22}|=1$ when the frequency is 0, and when the frequency is infinity, and that $|S_{22}|$ is equal to or higher than 1 at all frequencies therebetween. In the actual device characteristic, $|S_{22}|<1$ is exhibited when the frequency is 0, and when the frequency is infinity because of resistance components and the like, but $|S_{22}|>1$ and a negative resistance is exhibited in a microwave or milliwave band. Thus, a frequency band in which a negative resistance is exhibited exists in the circuit using the second transistor (gate-grounded transistor). Consequently, a negative resistance is also exhibited in the entire frequency multiplier and the characteristic is instable.

In the frequency multiplier according to the first embodiment of the present invention, the stabilizing resistor 26 is connected to the second gate G2 and $S_{22}$ is therefore expressed as follows.

$$S_{22} = \frac{1 + g_m + \omega^2(C_{gs}C_{ds}+C_{gs}C_{dg}+C_{ds}C_{dg}) + j\omega(C_{gs}-C_{dg}-g_mC_{dg}+R(C_{gs}+C_{dg}))}{1 + g_m - \omega^2(1+2R)(C_{gs}C_{ds}+C_{gs}C_{dg}+C_{ds}C_{dg}) + j\omega(C_{gs}+C_{dg}+2C_{ds}+(1+2R)g_mC_{dg}+R(C_{gs}+C_{dg}))} \quad \text{[Expresison 4]}$$

As a result of the provision of the stabilizing resistor 26, 2RgmCdg appears in the denominator imaginary term. It is therefore possible to ensure, by suitably determining R (stabilizing resistor 26), that $|S_{22}|$ does not exceed 1. As a result, the second transistor Tr2, i.e., the gate-grounded transistor, exhibits no negative resistance, and the frequency multiplier can be operated with stability.

A reflex gain produced by the second transistor Tr2 can be suppressed by setting the resistance value of the stabilizing resistor 26 to such a value that the absolute value of $S_{22}$ which is a reflection coefficient as seen from the output side does not exceed 1 ($S_{22}$ is equal to or smaller than 1). Also, since no resistor (damping resistor) is provided on the path through which the radiofrequency signal passes, a reduction in conversion gain of the frequency multiplier due to consumption of electric power of the second harmonic frequency by a damping resistor can be avoided.

Various modifications can be made to the frequency multiplier according to the first embodiment of the present invention. For example, no particular means is specified for setting each of the gate-source bias voltages on the source-grounded transistor (first transistor Tr1) and the gate-grounded transistor (second transistor Tr2) in the vicinity of the pinch-off voltage. The same can also be said with respect to frequency multipliers according to embodiments described below. Each of the frequency multipliers according to the embodiments described below has a number of commonalities with the first embodiment and will therefore be described mainly with respect to points of difference from the first embodiment.

Second Embodiment

Figure 2:
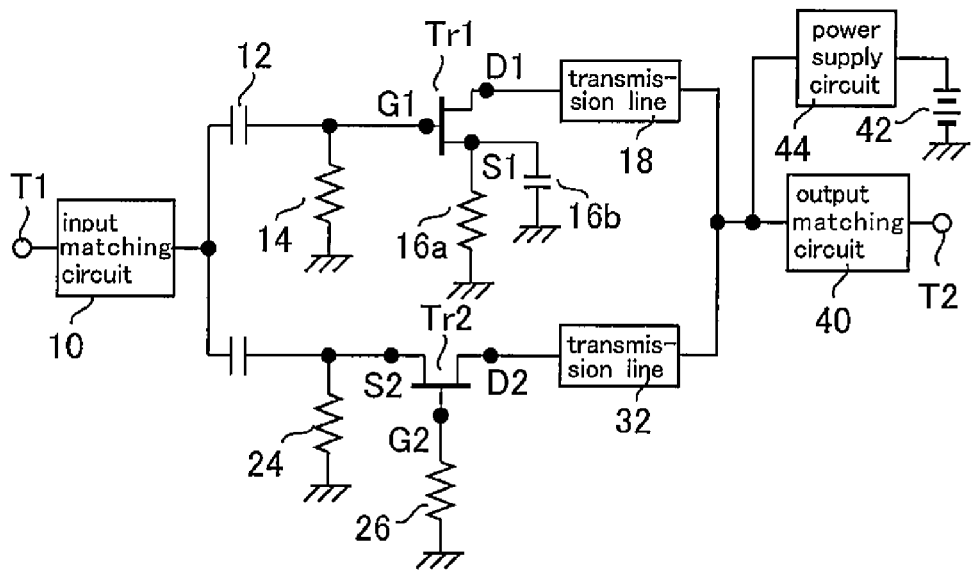
FIG. 2 is a circuit diagram of the frequency multiplier according to the second embodiment.

FIG. 2 is a circuit diagram of the frequency multiplier according to the second embodiment of the present invention. The first gate bias circuit 14 connected to the first gate G1 is formed of a resistor. The first source bias circuit 16 connected to the first source S1 is formed of a circuit in which a resistor 16a and a capacitor 16b are connected in parallel with each other. This arrangement needs no independent power supplies for applying the gate voltage and the source voltage to the first transistor Tr1.

The second source bias circuit 24 connected to the second source S2 is formed of a resistor. This arrangement needs no independent power supply for applying the source voltage to the second transistor Tr2.

One end of the stabilizing resistor 26 is connected to the gate of the second transistor Tr2, while the other end of the stabilizing resistor 26 is directly connected to a grounding metal. In this case, the stabilizing resistor 26 functions as gate bias circuit and there is no need for an independent power supply for applying the gate voltage.

As a result, the frequency multiplier can be driven by using the single power supply 42 connected to the drain terminals of the first transistor Tr1 and the second transistor Tr2.

Third Embodiment

Figure 3:
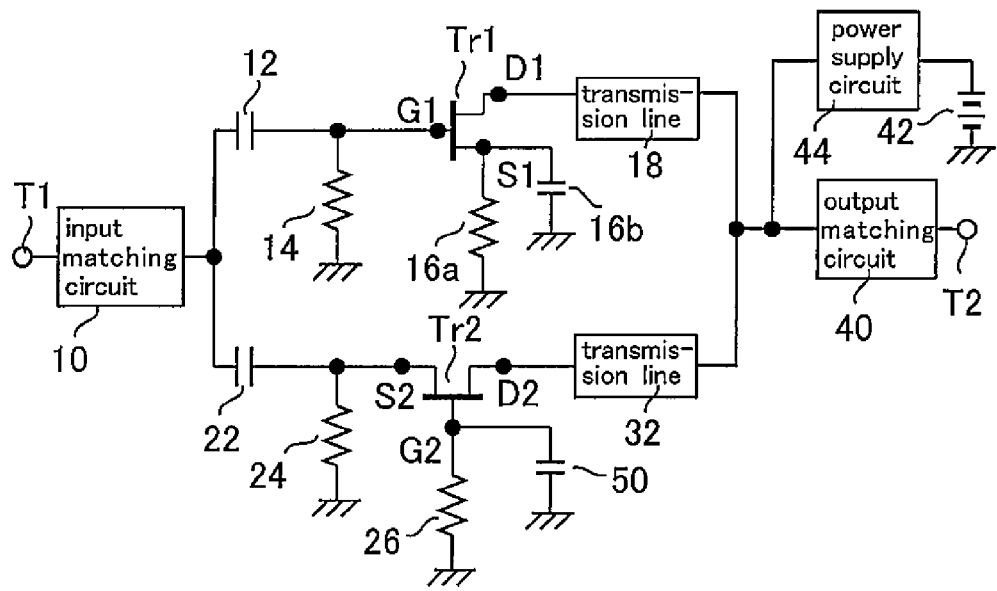
FIG. 3 is a circuit diagram of the frequency multiplier according to the third embodiment.

FIG. 3 is a circuit diagram of the frequency multiplier according to the third embodiment of the present invention. By the resistance value R of the stabilizing resistor 26, the negative resistance of the second transistor Tr2 is suppressed and the gain of the second transistor Tr2 is simultaneously reduced.

A capacitor 50 is therefore provided in parallel with the stabilizing resistor 26. That is, the capacitor 50 is connected between the second gate G2 and ground, thereby limiting the reduction in gain of the second transistor Tr2. The input-output matching is changed by the capacitor 50 to limit the reduction in gain of the second transistor Tr2. As a result of the provision of the capacitor 50, however, the stabilization effect (negative resistance reduction effect) is reduced. There is, therefore, a need to reduce the capacitance of the capacitor 50.

Fourth Embodiment

Figure 4:
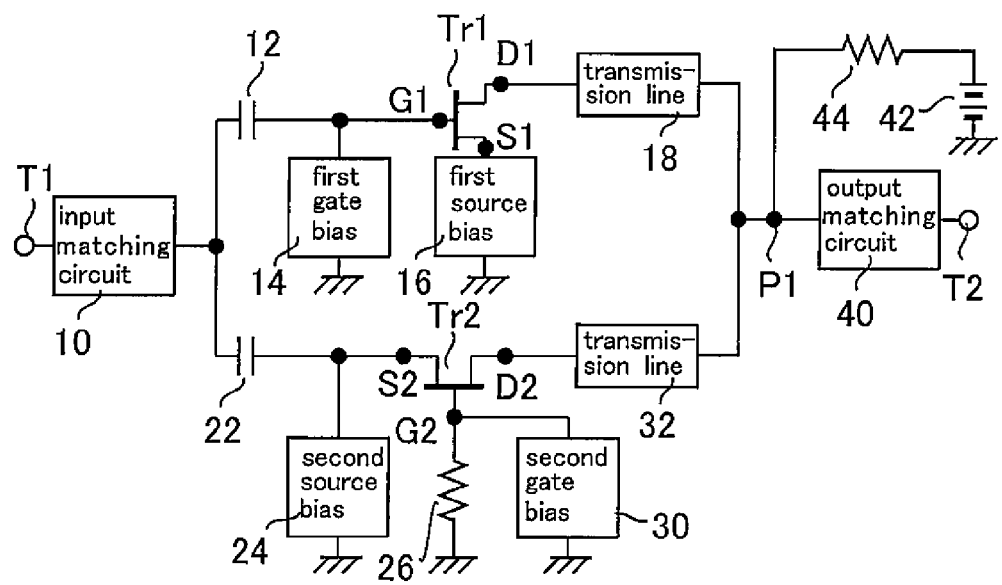
FIG. 4 is a circuit diagram of the frequency multiplier according to the fourth embodiment.

FIG. 4 is a circuit diagram of the frequency multiplier according to the fourth embodiment of the present invention. The power supply 42 for supplying a potential to the first drain D1 and the second drain D2 is provided on a branch line branching off from the main line through which a radiofrequency signal passes. A resistor is provided as power supply circuit 44. That is, a resistor is connected in series with the branch line. The point of connection between the branch line and the main line is a connection point P1.

A device for use in a microwave or milliwave band ordinarily uses a line having a line length of the 1/4 wavelength with the respect to the operating frequency and a capacitor for shorting a line end at a radiofrequency. Such a line is formed so as to appear as an open end as seen from the point of connection to a path through which a radiofrequency signal passes, thereby eliminating the influence on radiofrequency characteristics.

If a resistor having such a high resistance value as seen from the connection point P1 that the influence on radiofrequency characteristics is eliminated is provided as power supply circuit, then a voltage drop occurs simultaneously. In an amplifier, therefore, the efficiency is considerably reduced if the power supply circuit is formed of a resistor.

Also in the frequency multiplier that performs frequency multiplication on microwaves, a voltage drop occurs if the power supply circuit 44 is formed of a resistor. However, the current that flows through the frequency multiplier is small and, therefore, the influence of the reduction in efficiency through the entire system is small. The area occupied by the power supply circuit 44 formed of a resistor is markedly small in comparison with that occupied by the 1/4 wavelength line. The frequency multiplier can therefore be reduced in size.

A suitable combination of the features of the frequency multipliers according to the embodiments described above may be made.

According to the present invention, a resistor is connected to the gate of the gate-grounded transistor, so that the gate-grounded transistor can be stabilized.

Obviously many modifications and variations of the present invention are possible in the light of the above teachings. It is therefore to be understood that within the scope of the appended claims the invention may be practiced otherwise than as specifically described.

What is claimed is:

1. A frequency multiplier comprising:
an input terminal;
an output terminal;
a first transistor having a first gate to which a radio frequency signal is input from the input terminal, a first drain from which an output signal is issued to the output terminal, and a first source;
a second transistor having a second gate, a second source to which the radio frequency signal is input from the input terminal, and a second drain from which an output signal is issued to the output terminal; and
a stabilizing resistor whose one end is connected to the second gate and whose other end is connected to a grounding metal directly or via a capacitor
wherein no resistor exists in the path for the radio frequency signal, and
wherein the stabilizing resistor suppresses a reflex gain produced by the second transistor.

2. The frequency multiplier according to claim 1, wherein the resistance value of the stabilizing resistor is set to such a value that the absolute value of S22 which is a reflection coefficient as seen from the output side does not exceed 1.

3. The frequency multiplier according to claim 1, further comprising:
a first gate bias circuit connected to the first gate;
a first source bias circuit connected to the first source; and
a second source bias circuit connected to the second source,
wherein each of the first gate bias circuit, the first source bias circuit and the second source bias circuit is formed of a resistor.

4. The frequency multiplier according to claim 1, further comprising a capacitor connected to the second gate.

5. The frequency multiplier according to claim 1, further comprising:
a power supply connected to a branch line branching off from a main line through which the radio frequency signal passes, the power supply supplying a potential to the first drain and to the second drain; and
a resistor connected in series with the branch line.

6. A frequency multiplier comprising:
an input terminal;
an output terminal;
a first transistor having a first gate to which a radio frequency signal is input from the input terminal, a first drain from which an output signal is issued to the output terminal, and a first source;
a second transistor having a second gate, a second source to which the radio frequency signal is input from the input terminal, and a second drain from which an output signal is issued to the output terminal;
a stabilizing resistor which is a resistor connected to the second gate;
a first gate bias circuit connected to the first gate;
a first source bias circuit connected to the first source; and
a second source bias circuit connected to the second source,
wherein each of the first gate bias circuit, the first source bias circuit and the second source bias circuit is formed of a resistor,
wherein no resistor exists in the path for the radio frequency signal, and
wherein the stabilizing resistor suppresses a reflex gain produced by the second transistor.

7. A frequency multiplier comprising:
an input terminal;
an output terminal;
a first transistor having a first gate to which a radio frequency signal is input from the input terminal, a first drain from which an output signal is issued to the output terminal, and a first source;
a second transistor having a second gate, a second source to which the radio frequency signal is input from the input terminal, and a second drain from which an output signal is issued to the output terminal;
a stabilizing resistor which is a resistor connected to the second gate;
a power supply connected to a branch line branching off from a main line through which the radio frequency signal passes, the power supply supplying a potential to the first drain and to the second drain; and
a resistor connected in series with the branch line, wherein no resistor exists in the path for the radio frequency signal, and wherein the stabilizing resistor suppresses a reflex gain produced by the second transistor.

* * * * *